US009417285B2

(12) United States Patent
Wang et al.

(10) Patent No.: US 9,417,285 B2
(45) Date of Patent: Aug. 16, 2016

(54) INTEGRATED FAN-OUT PACKAGE-ON-PACKAGE TESTING

(71) Applicant: Taiwan Semiconductor Manufacturing Co., Ltd., Hsin-Chu (TW)

(72) Inventors: Mill-Jer Wang, Hsinchu (TW); Ching-Nen Peng, Hsinchu (TW); Hung-Chih Lin, Hsinchu (TW); Hao Chen, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 117 days.

(21) Appl. No.: 14/141,529

(22) Filed: Dec. 27, 2013

(65) Prior Publication Data
US 2015/0185282 A1    Jul. 2, 2015

(51) Int. Cl.
G01R 31/3185 (2006.01)
G01R 1/04 (2006.01)
G01R 31/28 (2006.01)

(52) U.S. Cl.
CPC ...... G01R 31/318513 (2013.01); G01R 1/0466 (2013.01); G01R 31/2886 (2013.01)

(58) Field of Classification Search
CPC ............... G01R 1/0408; G01R 1/0433; G01R 31/2886; G01R 31/2887; G01R 31/2896; H01L 25/0657

USPC .................................................. 324/762, 756
See application file for complete search history.

(56) References Cited

U.S. PATENT DOCUMENTS

| 5,572,144 A * | 11/1996 | Davidson et al. ........ 324/750.19 |
| 5,926,027 A * | 7/1999 | Bumb et al. ............. 324/750.25 |
| 6,574,763 B1 * | 6/2003 | Bertin et al. ................... 714/738 |
| 7,327,153 B2 * | 2/2008 | Weinraub ................. 324/756.01 |
| 2003/0151420 A1 * | 8/2003 | Bai et al. ........................ 324/755 |
| 2008/0012592 A1 * | 1/2008 | Song et al. .................... 324/755 |
| 2013/0076387 A1 * | 3/2013 | Ishikawa et al. ......... 324/762.03 |
| 2013/0293254 A1 * | 11/2013 | Chen et al. ............... 324/756.02 |
| 2015/0069623 A1 * | 3/2015 | Tsai et al. ..................... 257/774 |

* cited by examiner

Primary Examiner — Tung X Nguyen
Assistant Examiner — Akm Zakaria
(74) Attorney, Agent, or Firm — Duane Morris LLP

(57) ABSTRACT

A device for testing a bottom package of an integrated fan-out (InFO) Package-on-Package (PoP) comprises a bottom fixture having a space to accommodate the bottom package during testing and a detachable top cover, configured for conducting at least one test of the bottom package, wherein one or both of the bottom fixture and the top cover have a plurality of probing contacts for testing of the bottom package and wherein the device can be opened for placement of the bottom package under testing, and the cover is attachable to the bottom fixture for conducting the testing.

17 Claims, 18 Drawing Sheets

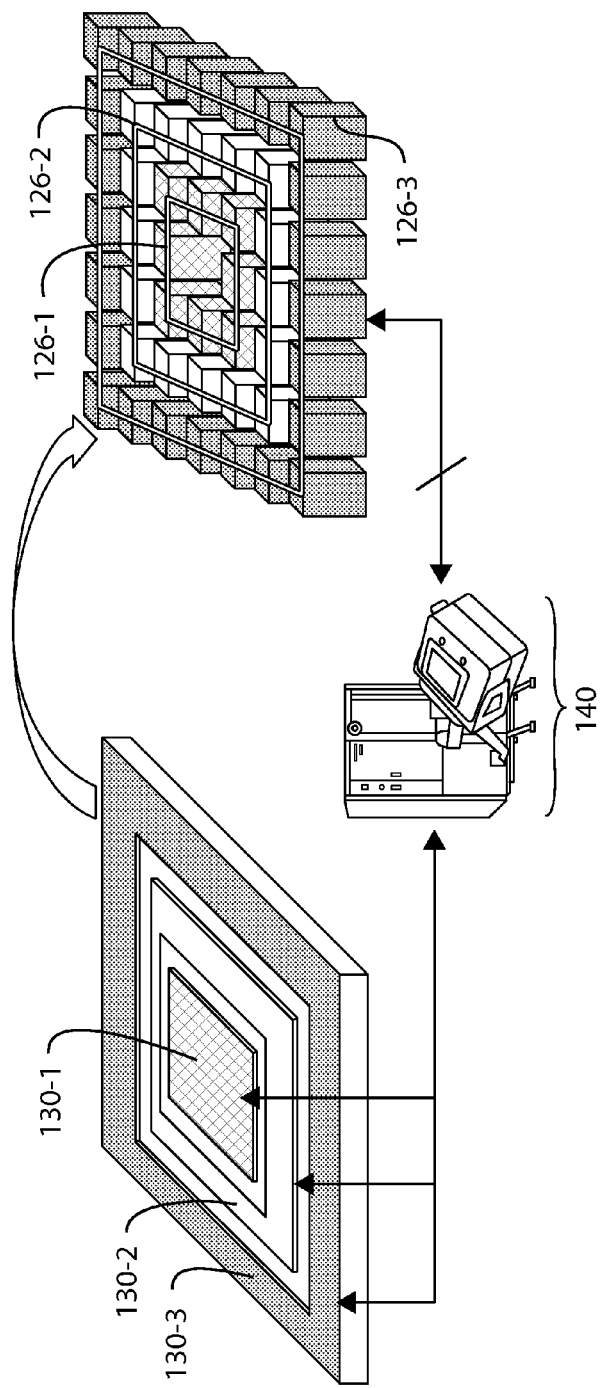
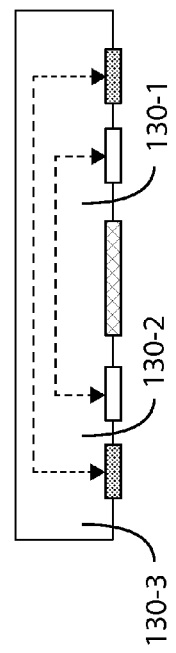
FIG. 3A
FIG. 3B

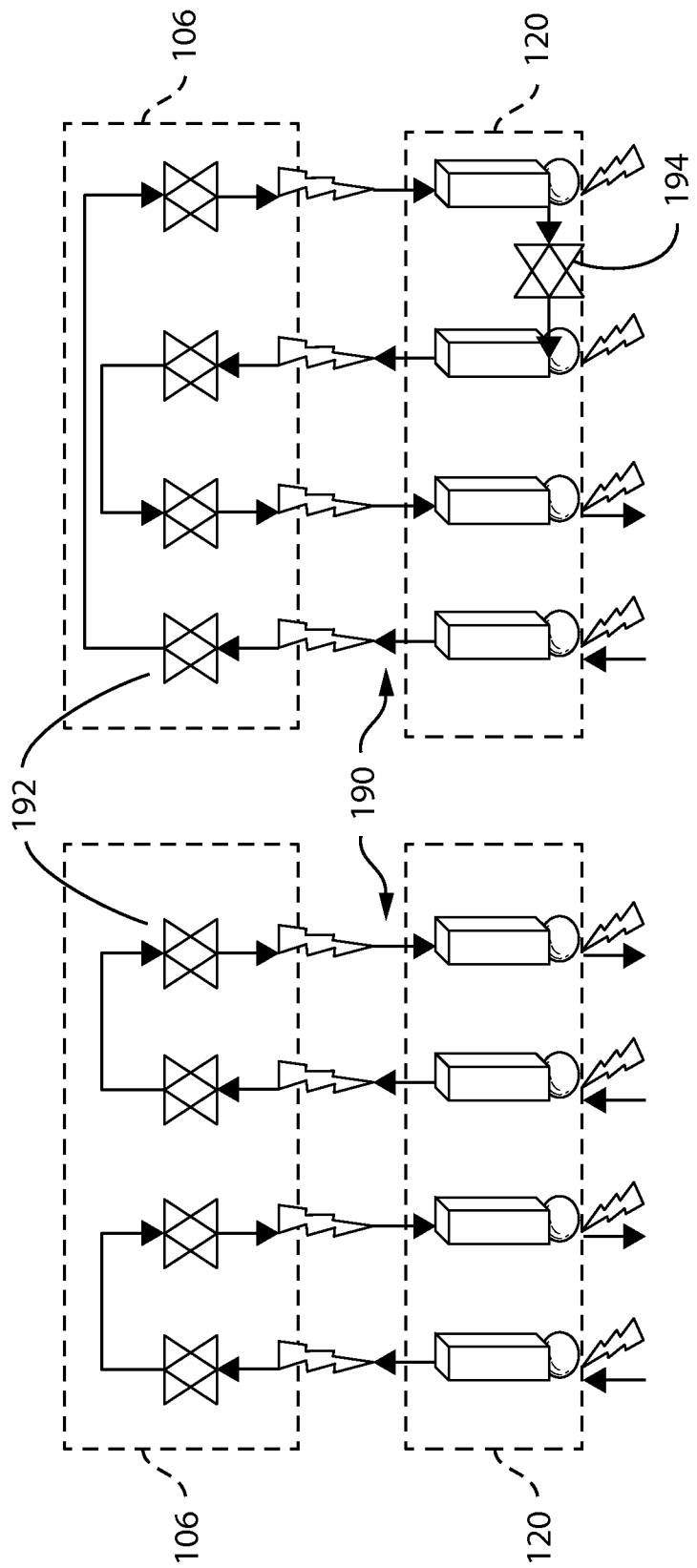

INTEGRATED FAN-OUT PACKAGE-ON-PACKAGE TESTING

FIELD OF DISCLOSURE

The disclosed systems and methods relate to testing of semiconductor devices. More particularly, the disclosed systems and methods relate to testing of semiconductor devices formed using package-on-package technologies.

BACKGROUND

State-of-the-art mobile applications are characterized by small form factor, low cost, tight power budget, and high electrical performance. As the demand for smaller electronic products grows, manufacturers and others in the electronics industry continually seek ways to reduce the size of integrated circuits used in the electronic products. In that regard, three-dimensional type integrated circuit (3D IC) packaging techniques have been developed and used.

One packaging technique that has been developed is Package-on-Package (PoP). As the name implies, PoP is a semiconductor packaging innovation that involves stacking one package on top of another package. For a non-limiting example, a PoP device may combine vertically discrete memory and logic ball grid array (BGA) packages. One emerging PoP packaging technology is integrated fan-out Package-on-Package (InFO PoP). A plurality of dies are embedded in a material (such as molding compound), at two or more locations horizontally separated from each other. Interconnects between dies are formed in one or more redistribution layers above the dies. Using this technology, copper interconnects formed after the exposure of on-chip aluminum pads, known as post-passivation interconnects (PPI), allow signals to fan out to regions larger than the silicon die shadow. InFO PoP provides distinct advantages over conventional PoP that utilizes wire binding for connections between the packages. First, I/O's can be redistributed to the fan-out region outside of the silicon die footprint for increased pin count at the package level. Second, passive devices such as inductors and capacitors can be formed over the molding compound for lower substrate loss and higher electrical performance. Third, a smaller form factor leads to better thermal behavior and hence a lower operating temperature for the same power budget, or alternatively, faster circuit operation for the same temperature profile.

BRIEF DESCRIPTION OF THE DRAWINGS

FIG. 3A depicts an example of the dual-side pogo socket where the side of top cover facing the bottom package under testing is attached to a plurality of conductive areas in accordance with some embodiments.

FIG. 3B shows a side view of the plurality of conductive areas used to short the respective TIV rings to form multiple conductive rings in accordance with some embodiments.

FIGS. 9A and 9B depict examples of inter-connects connecting routes that cross between different objects during testing of the bottom package in accordance with some embodiments.

DETAILED DESCRIPTION

This description of the exemplary embodiments is intended to be read in connection with the accompanying drawings, which are to be considered part of the entire written description. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled," "connected" and "interconnected," refer to a relationship wherein structures communicate with one another either directly or indirectly through intervening structures unless expressly described otherwise.

Various testing mechanisms that achieve efficient and comprehensive testing for InFO PoP devices are disclosed. In one embodiment, a dual-side testing socket with a bottom fixture and a top cover is used for testing of the bottom package (or InFO Known Good Stack (KGS) die) of an InFO PoP device with the top package unstacked, wherein the top cover of the socket is detachable (and thus replaceable) and configurable for conducting various tests of the unstacked bottom package of the InFO PoP. In another embodiment, various testing circuitry such as a bidirectional test control unit (BTCU) are embedded within the one of the integrated circuits (ICs) in the top cover and/or the bottom package under testing to facilitate the testing of these ICs in the InFO PoP device.

Figure 1A:
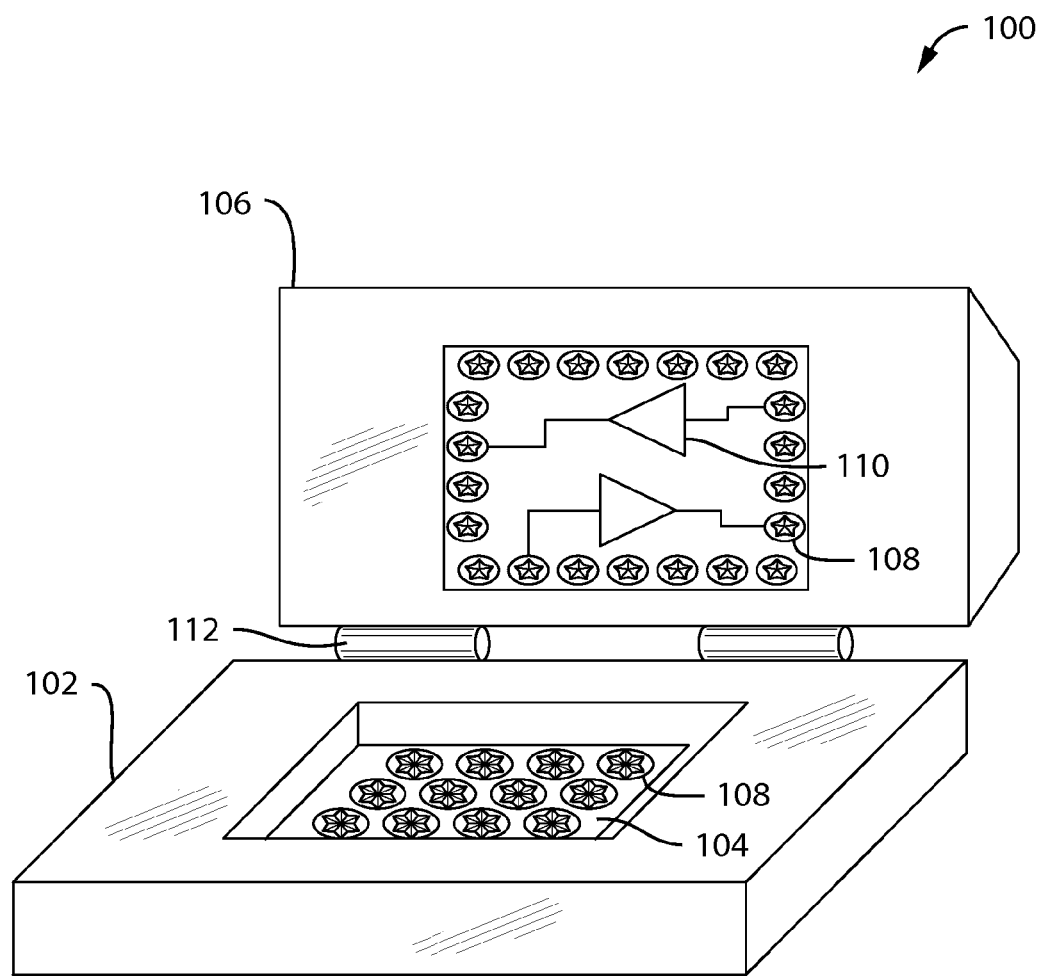
FIG. 1A illustrates one example of a dual-side pogo socket for the testing of a bottom package of an InFO PoP in accordance with some embodiments.
Figure 1B:
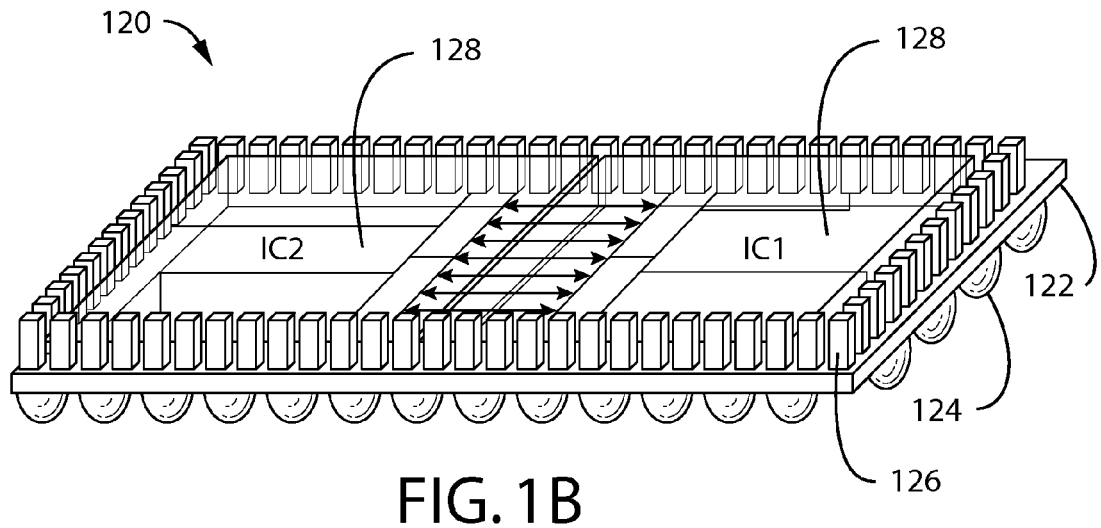
FIG. 1B depicts an example of the bottom package before top package is stacked in accordance with some embodiments.

FIG. 1A illustrates one example of a dual-side pogo socket 100 for the testing of a bottom package 120 of an InFO PoP device (the bottom package 120 is shown in FIG. 1B). Socket 100 includes a bottom fixture 102 having a carved out space 104 to accommodate the bottom package 120 during testing. The bottom fixture 102 does not need to be changed during the testing of the bottom package. Socket 100 further includes an top cover 106, which is detachable and replaceable for the purpose of conducting various tests of the bottom package 120. During testing of the bottom package 120, only the top cover 106 is changed for the purpose of conducting different tests, such as short test, loopback, or function tests as discussed below. One or both of the bottom fixture 102 and the top cover 106 have a plurality of probing contacts 108, which can be but are not limited to pogos or super buttons used for testing of the bottom package 120. In some embodiments, the top cover 106 may further include additional circuitry 110 for testing of the bottom package as discussed below. In some embodiments, the bottom fixture 102 and the top cover 106 are connected with each other via pivot joint 112 on one side of the socket 100 so that the socket 100 can be opened for placement of the bottom package 120 under testing.

FIG. 1B depicts an example of a bottom package 120 of an InFO PoP device before a top package (e.g., memory) of the InFO PoP device is stacked above bottom package 120. In some embodiments, bottom package 120 is formed on a carrier (substrate or wafer) 122, which for a non-limiting example, can be made of glass. As shown in FIG. 1B, bottom package 120 includes one or more integrated circuits (ICs) or InFO KGS dies 128 placed on carrier 120, wherein the ICs 128 are known good dies (KGDs) placed as part of the bottom package 120 under testing, also known as device under testing (DUT). In some embodiments, a plurality of (probing) BGA solder balls 124 are formed on the bottom side of carrier 122 for connection with the pogos 108 on the bottom fixture 102 of socket 100 for testing of the bottom package 120. In some embodiments, a plurality of Thru InFO Vias (TIVs) 126 are formed on the top side of carrier 122 for connection with the detachable top cover 106 of socket 100 for testing of the bottom package 120. In some embodiments, carrier 122 has one or more redistribution layers (RDL) (not shown) formed on top of it, wherein the RDL is an extra interconnect layer containing conductive (e.g., metal or polysilicon) lines and via connections used to connect the various components (e.g., BGAs 124, TIVs 126, and ICs 128) in bottom package 120.

Figure 1C:
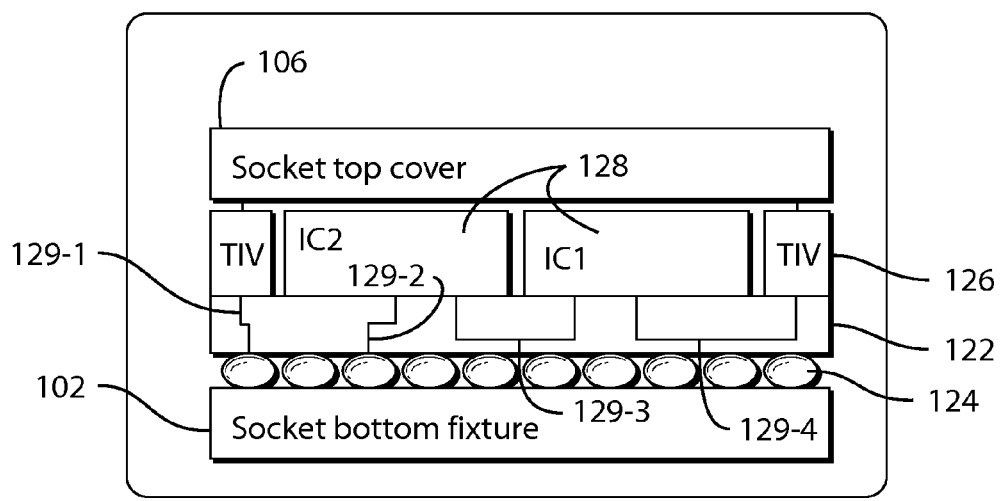
FIG. 1C shows how the bottom package is placed between the bottom fixture and the top cover of the dual-side pogo socket for testing in accordance with some embodiments.

FIG. 1C shows how bottom package 120 is placed between the bottom fixture 102 and the top cover 106 of the dual-side pogo socket 100 for testing. As shown in FIG. 1C, BGAs 124 of bottom package 120 are in contact with the pogos (not shown) in bottom fixture 102 and TIVs 126 of bottom package 120 are in contact with the detachable top cover 106 during testing. Since TIVs 126 are connected to top cover 106 and are no longer open-ended under such testing configuration, at least the following connecting paths of bottom package 120 can be tested: BGA 124 to TIV 126 (marked as path 129-1 in FIG. 1C), BGA 124 to ICs 128 through RDL (marked as path 129-2 in FIG. 1C), IC 128 to IC 128 through RDL (marked as path 129-3 in FIG. 1C), and IC 128 to TIV 126 (marked as path 129-4 in FIG. 1C).

Figure 2:
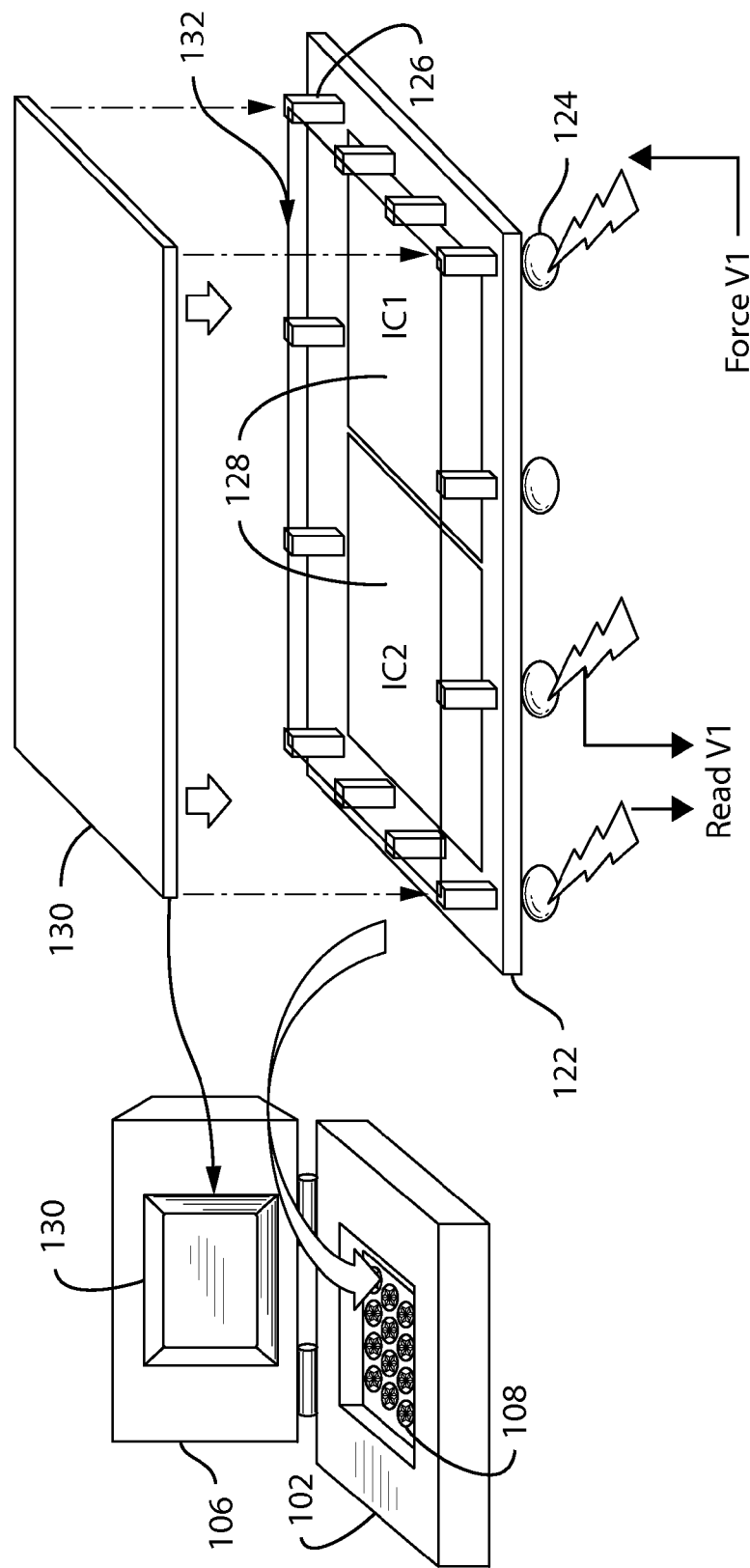
FIG. 2 depicts an example of the dual-side pogo socket where the side of top cover facing the bottom package under testing is attached to a layer of conductive material in accordance with some embodiments.

In some embodiments, the side of detachable top cover 106 facing the bottom package 120 under testing is attached to a layer of conductive material 130 as shown in the example depicted in FIG. 2. Here, the conductive material 130 can be but is not limited to, a metal plate or film. As shown in FIG. 2, when placed in contact with TIVs 126 of the bottom package 120, the conductive material 130 shorts the TIVs 126 together and forms a top side route 132 within top cover 106 of the socket 100 for a quick and low cost testing of the bottom package without requiring any additional circuitry in the top cover 106. BGA balls 124 on the bottom side of carrier 122 are in contact with the probing contacts 108 in bottom fixture 102, wherein a testing input voltage signal V1 can be transmitted into the bottom package through one of the BGAs 124 on the bottom side of carrier 122 and an output signal can be read from one or more other BGAs 124 on the bottom side of carrier 122 to determine if the bottom package functions properly.

In some embodiments, the side of detachable top cover 106 facing the bottom package 120 under testing is attached to a plurality of conductive areas 130-1, ..., 130-n as shown in the example of FIG. 3A. As shown in FIG. 3A, the plurality of conductive areas 130s are unconnected to and isolated from each other. In some embodiments, the plurality of conductive areas 130s are arranged as rings, each covering and testing one of a plurality of rings of TIVs 126-1, ..., 126-n in a TIV array of the bottom package 120. In some embodiments, a signal TIV 126 is covered by a single conductive ring 130. As shown in FIG. 3A, automatic testing equipment (ATE) 140 is used to transmit testing signals into and measure output signals out of each of the conductive rings during testing. FIG. 3B shows a side view of the plurality of conductive areas 130-1, ..., 130-n used to short the respective TIV rings 126-1, ..., 126-n together to form multiple conductive rings.

Figure 4A:
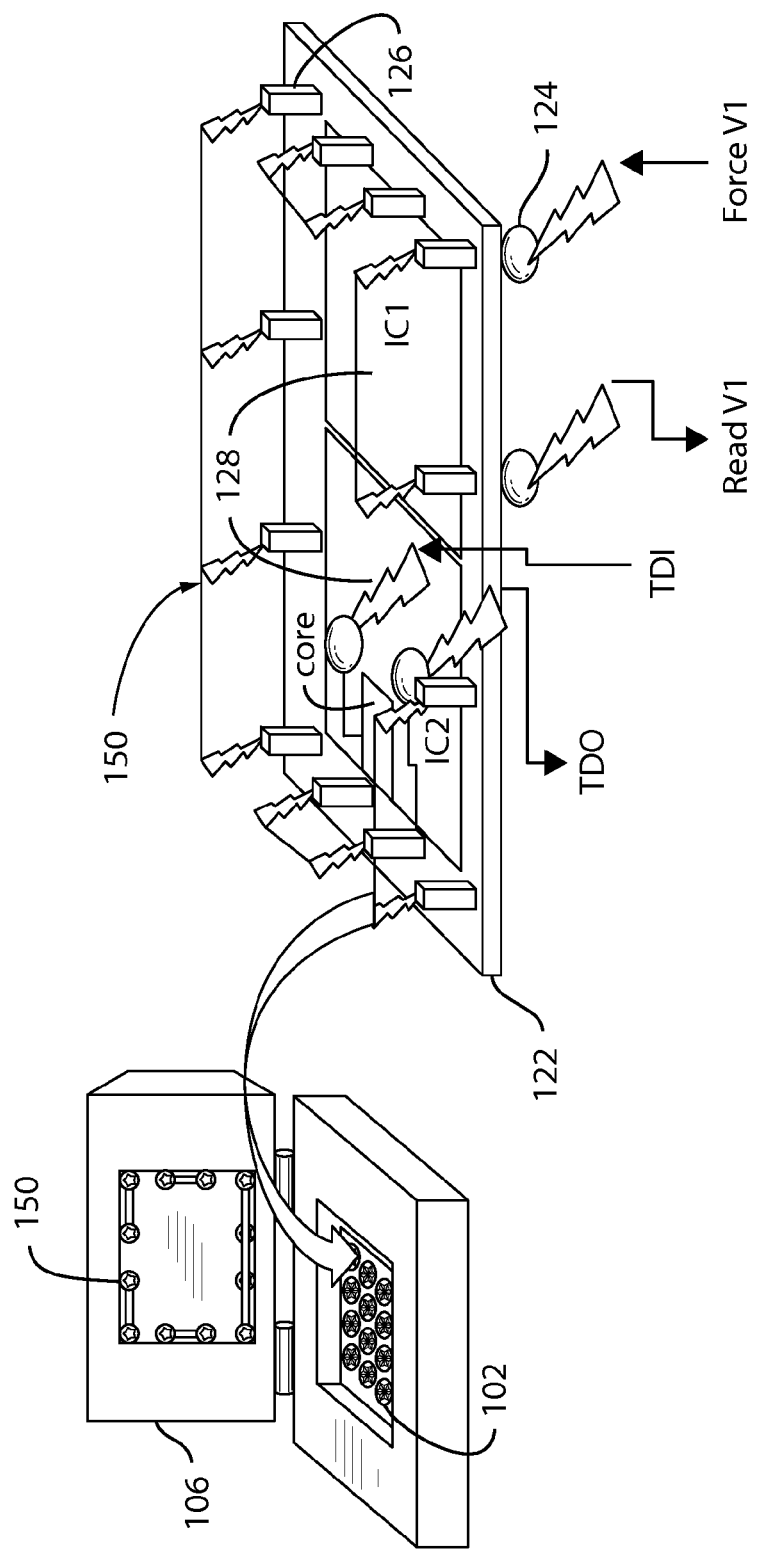
FIG. 4A depicts an example of the dual-side pogo socket where the side of top cover facing the bottom package under testing includes a plurality of shorted segments formed by conductive wires each connecting a set of specified probing contacts in accordance with some embodiments.

In some embodiments, the side of the detachable top cover 106 facing the bottom package 120 under testing includes a plurality of shorted segments 150 formed by conductive wires each connecting a set of specified probing contacts 108 (e.g., pogos) in the top cover 106 as shown in the example of FIG. 4A. These short segments 150 are configured for loopback test, which is a test in which an input signal is sent from an ATE (not shown) and returned (looped back) to the ATE to determine whether the bottom package under testing functions properly. When top cover 106 is closed (engaged), TIVs 126 on carrier 122 are shorted together by the corresponding segments 150 for a quick and low cost test solution without requiring any extra circuit in top cover 106. In some embodiments, a testing voltage signal V1 can be transmitted into and read from the bottom package through designated BGA balls 124 on the bottom side of carrier 122, wherein such designated BGA balls 124 have been shorted by the short segments 150. Other non-shorted BGA balls 124 cannot read the output from testing signal V1. Here, the testing signal can be either DC or AC signals.

Figure 4B:
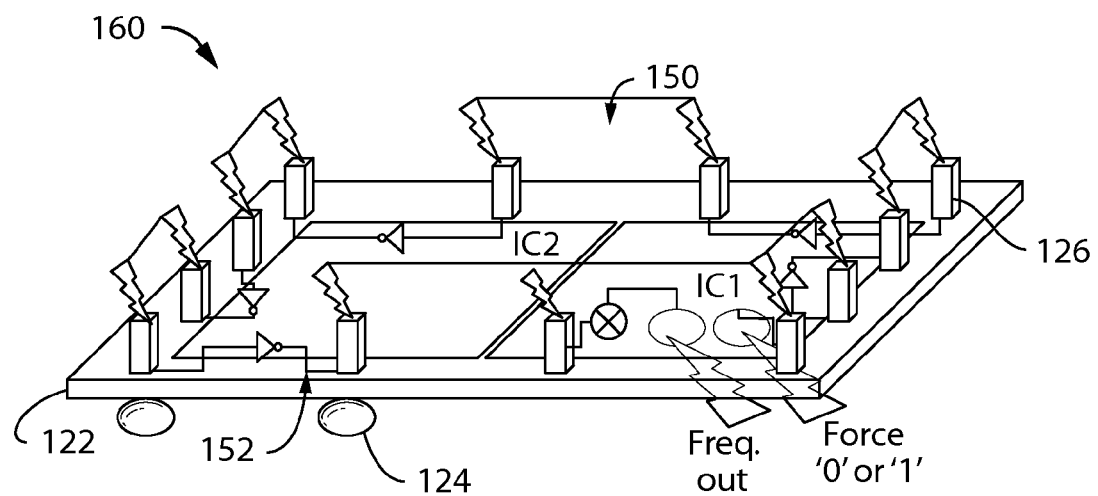
FIG. 4B depicts an example of a ring oscillator formed by circuit components in the one or more ICs to generate a clock signal in accordance with some embodiments.

In some embodiments, the loopback test is performed by built in self test (BIST) or core logic of the one or more ICs 128 in the bottom package 120 under testing, wherein the ICs 128 control the testing by providing input signal TDI into, and measuring output signal TDO out from the bottom package 120. FIG. 4B depicts an example of a Ring OSCillator (ROSC) 160 formed by circuit components such as an odd number of chained inverters in the one or more ICs 128 to generate a clock signal. Here, the TIVs 126 are shorted by short segments 150 while route 152 of ROSC 160 is controlled and switched by the one or more ICs 128, which forces '0' or '1' into and reads frequency out of the bottom package during ROSC testing.

Figure 5:
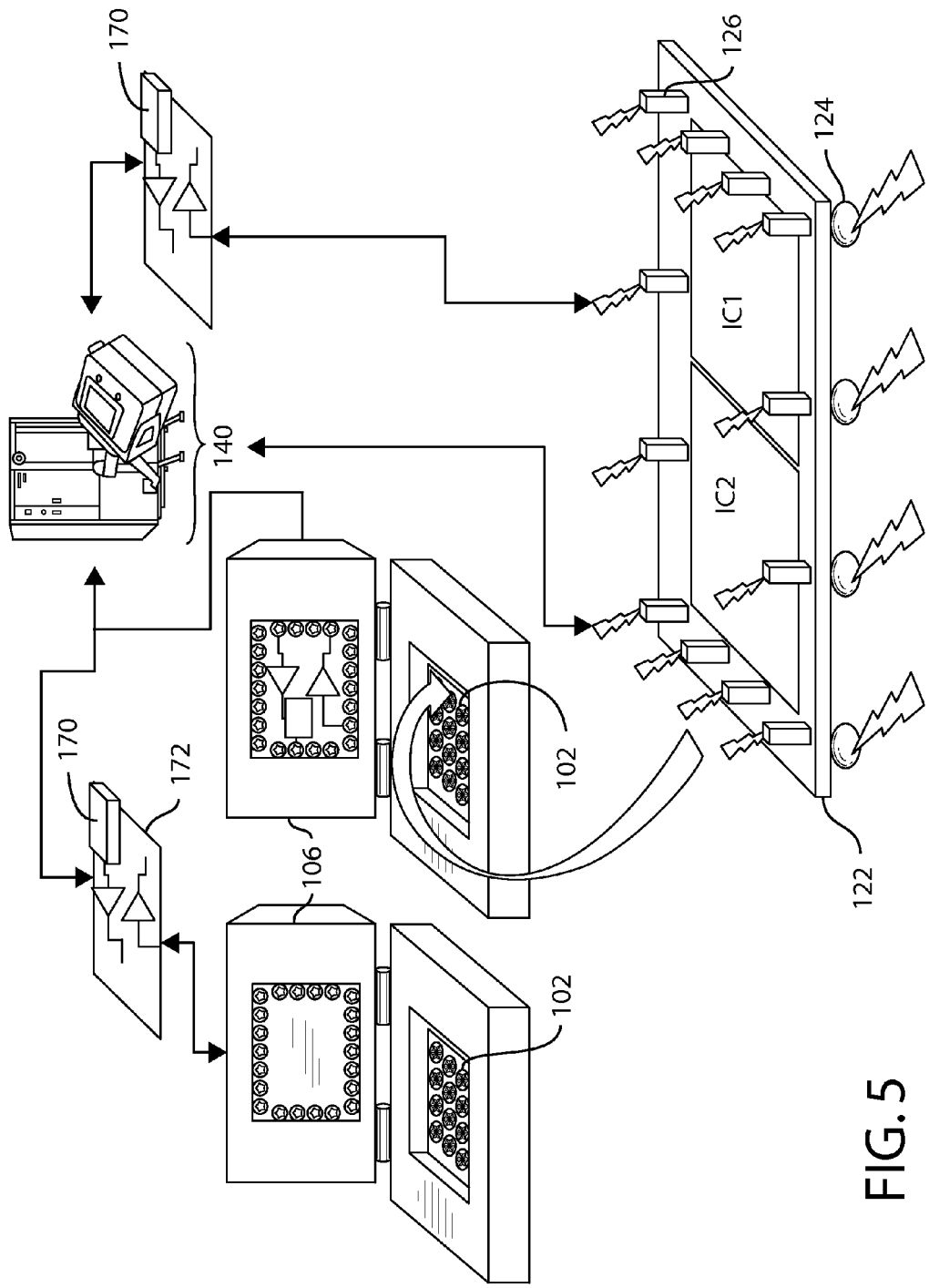
FIG. 5 depicts an example of the dual-side pogo socket where the side of top cover facing the bottom package under testing includes a substrate or micro PCB with a top die or IC placed on it in accordance with some embodiments.

In some embodiments, a substrate or micro printed circuit board (PCB) 172 with a top die or IC 170 placed on it is further embedded into the side of top cover 106 facing the bottom package under testing as shown by the example depicted in FIG. 5. Unlike ICs 128 that are DUT, top die 170 is considered to be a KGD, meaning that it has been verified to be 100% functional, which enables full function testing of the bottom package by simulating the environment and conditions of InFO POP device when the top package (e.g., memory) is stacked on the bottom package. During testing, probing contacts 108 (e.g., pogos) in the top cover 106 is configured to transmit signals provided by ATE 140 and/or the top die 170 to the bottom package through TIVs 126 to probing contacts 108 in the bottom fixture 102. In some embodiments, signals transmitted from top die 170 are programmable, and each probing contact 108 is independently connected to and controlled by ATE 140 and/or top die 170 in top cover 106. In some embodiments, substrate 172 is configured to include the top die 170 before substrate 172 is embedded into top cover 106, and the top die 170 is replaceable.

Figure 6:
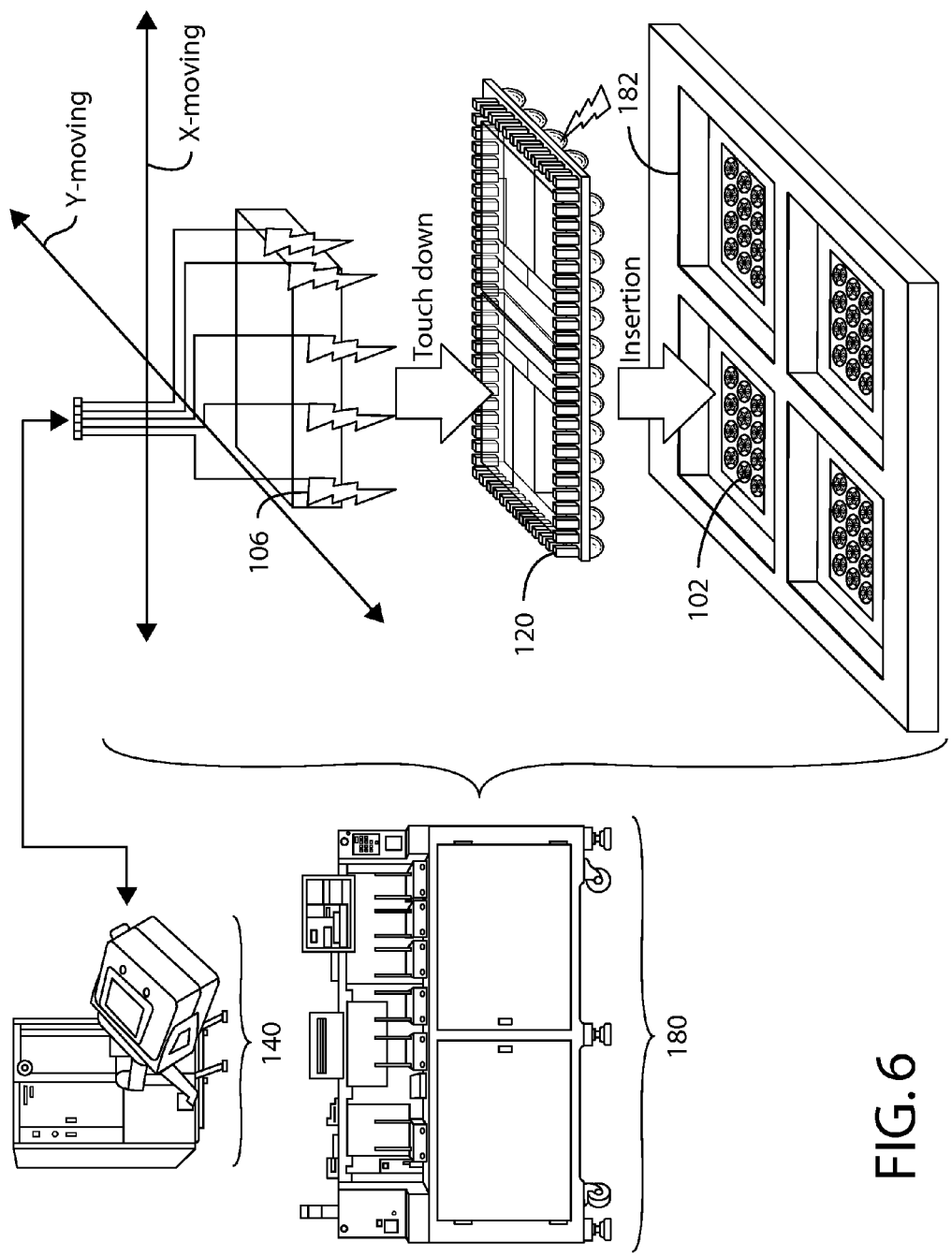
FIG. 6 depicts an example of an IC test handler that places the replaceable top cover automatically for testing of the bottom package during production in accordance with some embodiments.

In some embodiments, the detachable top cover 106 can be replaced automatically (instead of manually) for testing of bottom package 120 during production by an IC test handler 180 as shown by the example depicted in FIG. 6. In some embodiments, IC test handler 180 utilizes a changing kit 182, which is able to accommodate a plurality of socket bottom fixtures 102 for placing of bottom package 120 and can be changed by test handler 180 for automatic testing DUT during production. Once the bottom package 120 is placed or inserted into the changing kit 182, test handler 180 then places and/or replaces top cover 106 on top of the bottom package 120 to form a complete socket 100 with the respective bottom fixture 102 for the testing of the bottom package 120. In some embodiments, test handler 180 is able to move the top cover 106 in X and Y directions before touching down the top cover 106 on top of the bottom package 120. ATE 140 then provides and measures various testing signals through the top cover 106 as described above. Unlike a conventional test handler, IC test handler 180 is able to place various kinds of detachable top cover 106 described above, which has, for non-limiting examples, conductive materials, circuitry, and ICs embedded in it before attaching the top cover 106 on top of the bottom package 120.

Figure 7:
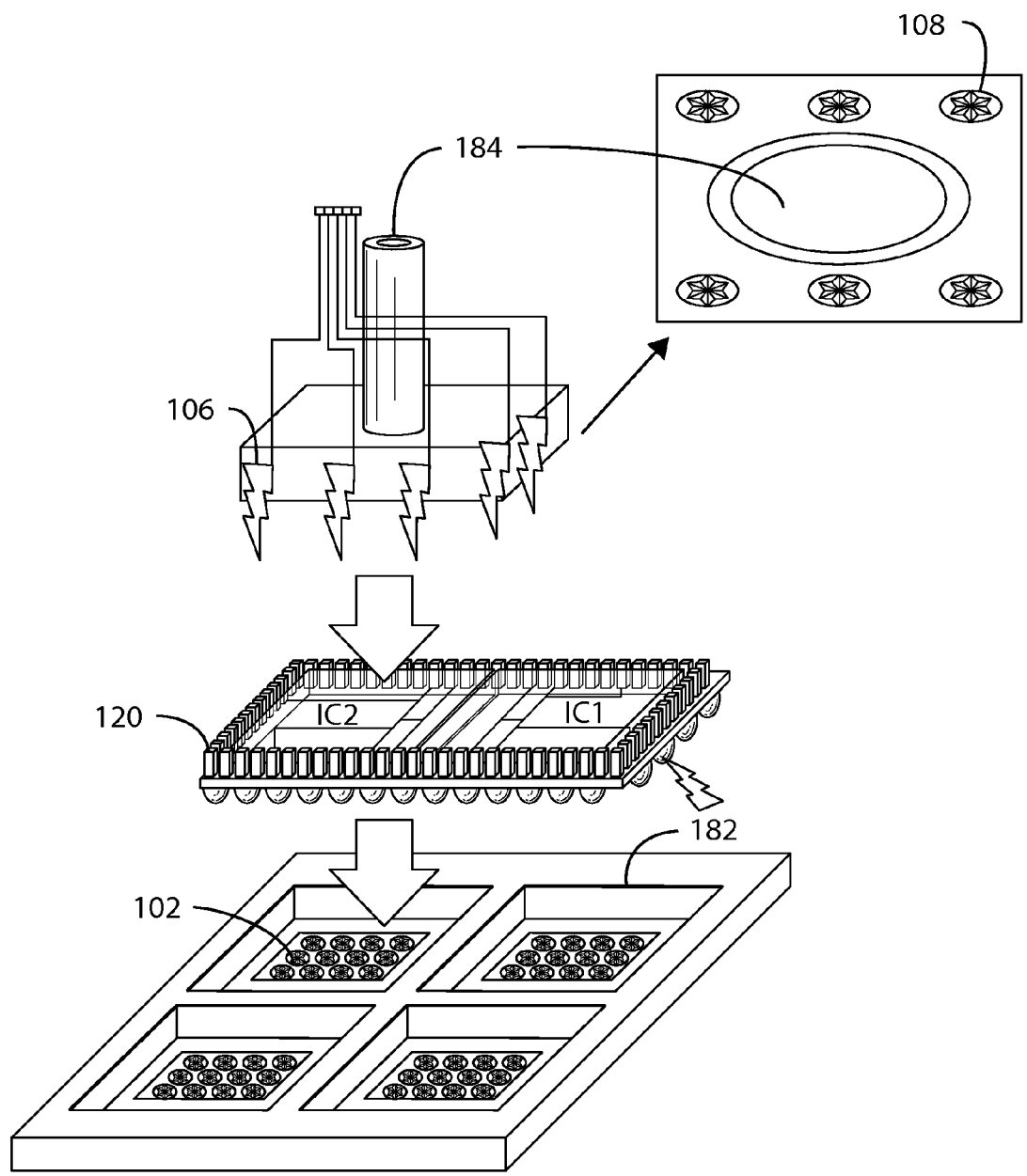
FIG. 7 depicts an example of a replaceable top cover having a hollow hole that connects to an air supplying source in accordance with some embodiments.

In some embodiments, the detachable top cover 106 includes a hollow hole 184, which connects to an air supplying source (not shown). As shown in FIG. 7, hollow hole 184 can be placed amid the plurality of probing contacts 108 on the side of the top cover 106 facing bottom package 120. During the testing of bottom package 120, hollow hole 184 permits introduction of hot or cold air from the air supplying source into the socket for high temperature or low temperature testing of the DUTs in the bottom package 120.

Figure 8:
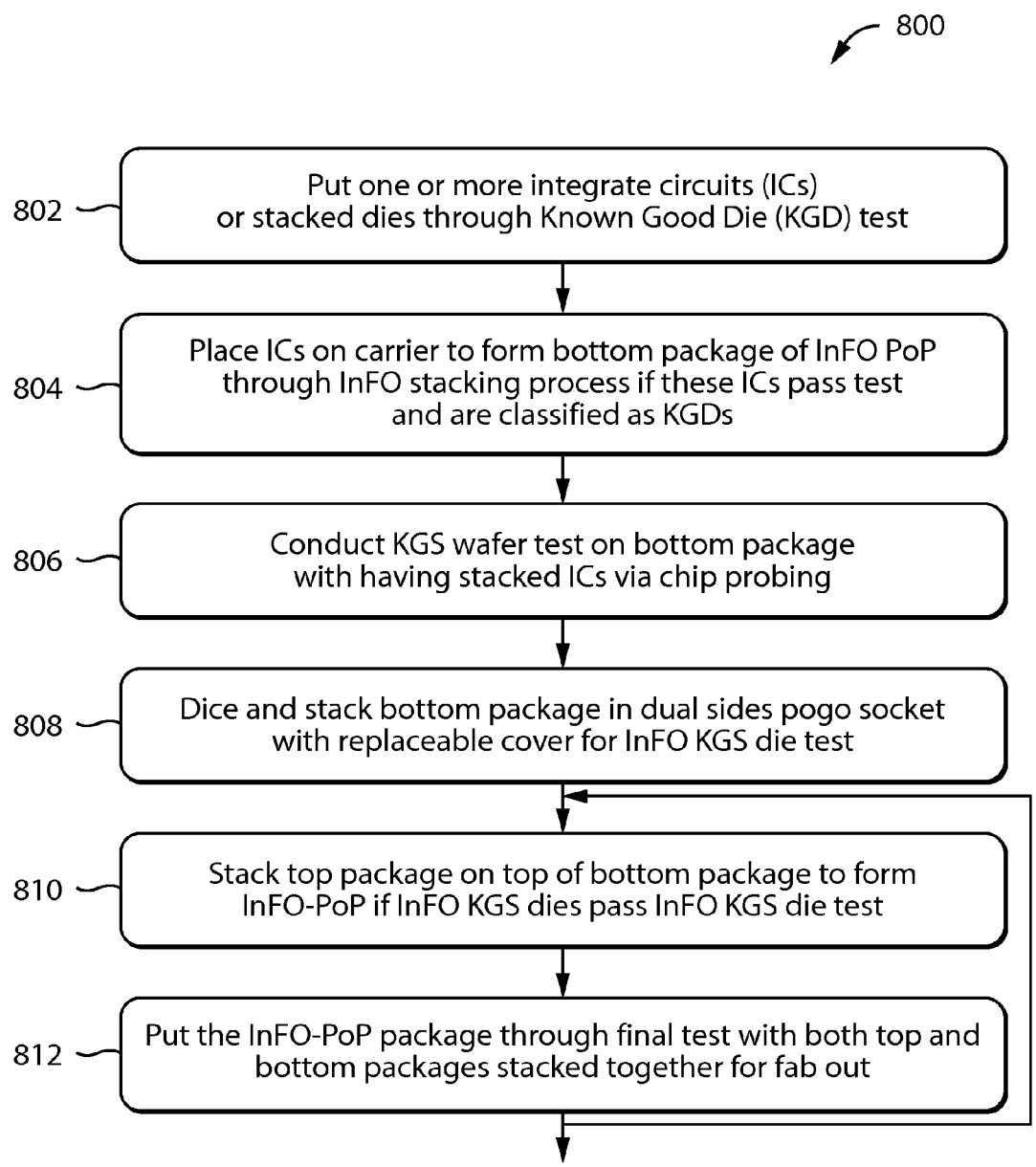
FIG. 8 depicts an example of a flow chart of a method for InFO-PoP production testing flow in accordance with some embodiments.

FIG. 8 depicts an example of a flow chart 800 of a method for InFO PoP production testing flow. At step 802, one or more integrated circuits (ICs) or stacked dies is put through a Known Good Die (KGD) test. If these ICs pass the KGD test and are classified as KGDs, they are placed on a carrier/wafer to form a bottom package of an integrated fan-out (InFO) PoP through an InFO stacking process at step 804, wherein the InFO process stacking may also include processes for forming TIVs, RDL and BGA balls of the bottom package. At step 806, a KGS wafer test is conducted on the bottom package having the stacked ICs via chip probing. At step 808, the bottom package is diced and stacked in a dual-side pogo socket with a detachable cover for an InFO Known Good Stack (KGS) die test. If the bottom package passes the InFO KGS die test, a top package is stacked on top of the bottom package to form an InFO-PoP at step 810. At step 812, the InFO-PoP package is put through a final test with both the top and the bottom packages stacked together. In some embodiments, the flow may loop back to step 810 after the testing at step 814, where the package goes through further stacking and testing of additional packages on top of the top package.

During the testing of the InFO KGS dies in the bottom package, connection between and/or within the circuitry may be broken. Consequently, testing signals from ATE are rerouted or switched to an alternative path so that the testing of the InFO KGS dies can continue to proceed. Signal switching comprises either "inter-connects" or "intra-connects," as described herein, or both: As shown in the examples of FIGS. 9A and 9B, inter-connects 190 are connecting routes that cross between different objects, wherein each object can be but are not limited to one or more of the detachable top cover 106 and its embedded circuitry or ICs, and various components such as ICs(IC1 and IC2)/DUTs in bottom package 120 as discussed above. In the example as shown in FIG. 9A, the inter-connects 190 of testing signals can be configured or switched by testing circuitry 192 embedded in the top cover 106. In the example as shown in FIG. 9B, the inter-connects 190 of testing signals can be configured or switched by both the testing circuitry 192 embedded in the top cover 106 as well as the testing circuitry 194 embedded in the ICs 128 of bottom package 120. In some embodiments, the inter-connects 190 are alternatively established between ICs/dies 128 inside the bottom package 120 and the top cover 106, wherein the ICs are either vertically stacked or horizontally assembled. Intra-connects comprise connecting routes circuits inside each object, such as detachable top cover 106 or inside each IC chip/circuitry within the top cover 106 or bottom package 120.

Figure 10A:
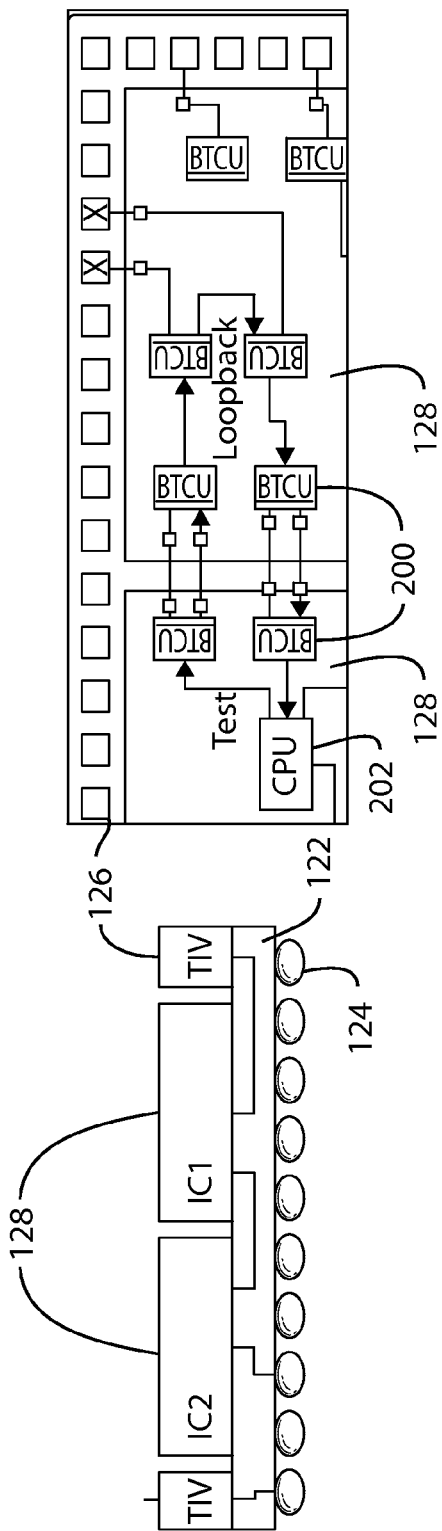
FIG. 10A depicts an example of a plurality of testing circuit components utilized to conduct loopback test between two or more objects in accordance with some embodiments.

In some embodiments, testing circuitry can be deployed for signal switching between different objects for purposes of conducting RDL interconnect and loopback test: Here, as shown by the example of FIG. 10A, a plurality of testing circuit components 200 are included in two or more objects and are utilized to conduct loopback test between the objects, wherein each object can be but is not limited to, any combination of ICs (e.g, IC1 and IC2) and fixtures (e.g., TIVs, and BGAs) in the top cover of the socket and the bottom package being tested. Since TIVs 126 marked by "X" are open ended in the bottom package 120 with top package (e.g., memory) unstacked, testing circuit components 200 are used to "loop the testing signals back" to CPU 202 that originates the testing signals to complete the testing of the inter-connects between the dies and to repair broken connections if any.

Figure 10B:
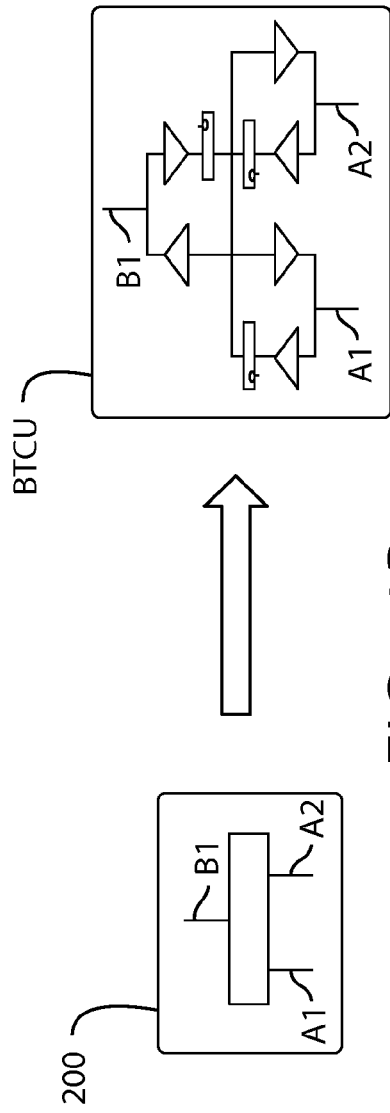
FIG. 10B depicts an example of a bidirectional testing circuit component in accordance with some embodiments.

In some embodiments, testing circuit components 200 are embedded in and controlled by ICs/dies 128 being tested. In some embodiments, each testing circuit component 200 is bidirectional as shown in the example of FIG. 10B, which allows signal paths among three pins of testing circuit component 200, A1, A2, and B1, from A1 to B1, A1 to A2, B1 to A1 and B1 to A2. In some embodiments, each testing circuit component 200 is implemented as a Bidirectional Test Control Unit (BTCU), which schematics is shown in FIG. 10B. In the following discussion, BTCU is used as a non-limiting example of testing circuit component 200 for signal switching during the testing and repairing of InFO PoP structure.

Figure 11:
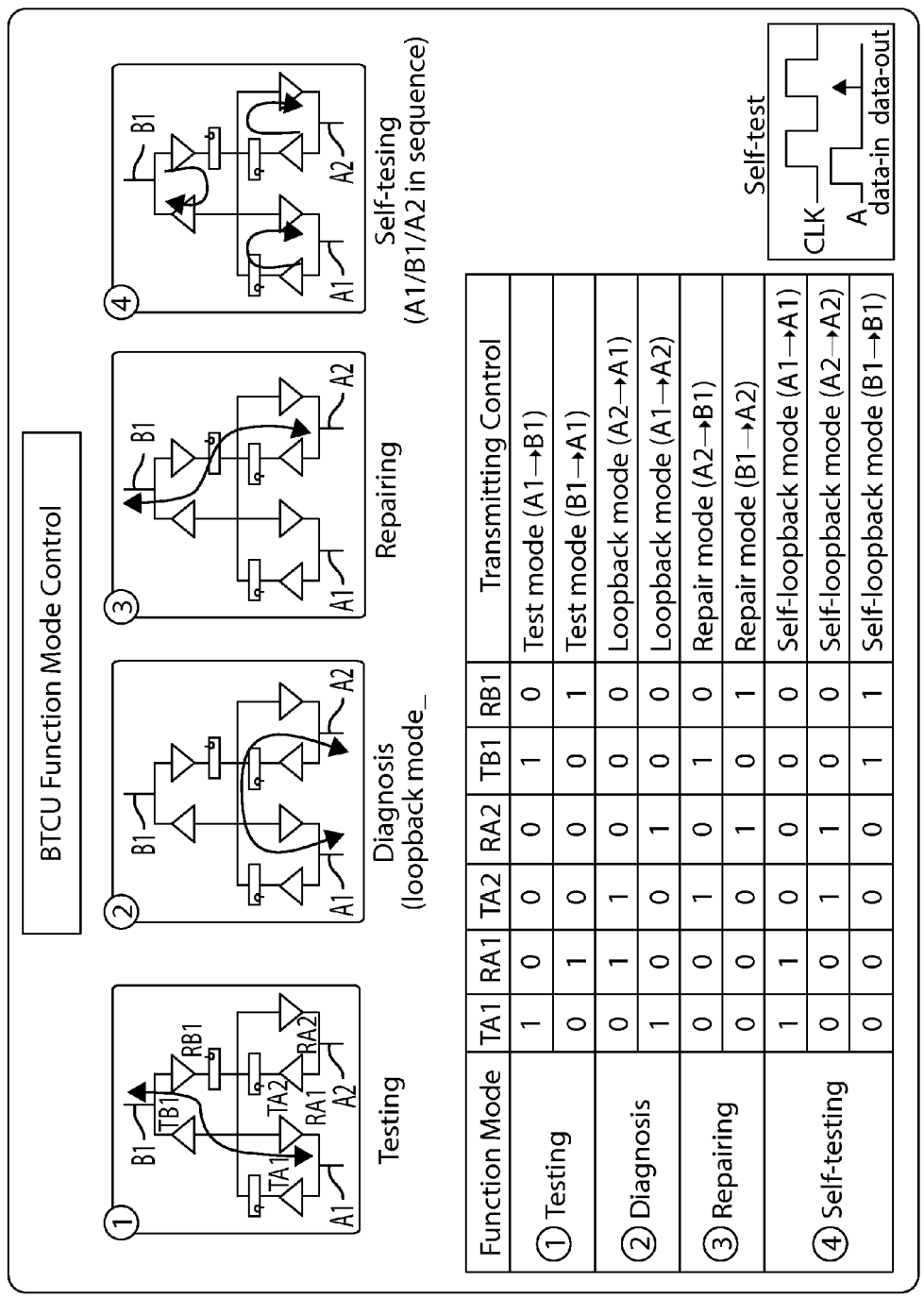
FIG. 11 depicts various function modes of a BTCU as controlled by a plurality of control signals in accordance with some embodiments.

FIG. 11 depicts various function modes of a BTCU as controlled by a plurality of control signals such as TA1, RA1, TA2, RA2, TB1, and RBI. Theses control signals are generated by the ICs/dies 128 in which the BTCU is embedded. As shown by FIG. 11, the BTCU operates under one of testing, diagnosis (loopback), repairing, and self-testing mode as controlled by the control signals. In the testing mode, one or more testing signals are transmitted between A1 and B1 in both directions. In the diagnosis mode, one or more testing signals are looped back between A1 and A2 instead of being transmitted forward. In the repairing mode, one or more testing signals are switched away from potentially damaged route between A1 and B1 to an alternative route between A2 and B1 instead. In the self-testing mode, each pin A1, B1, and A2 of the BTCU is tested in sequence to make sure that the BTCU functions properly.

Figure 12:
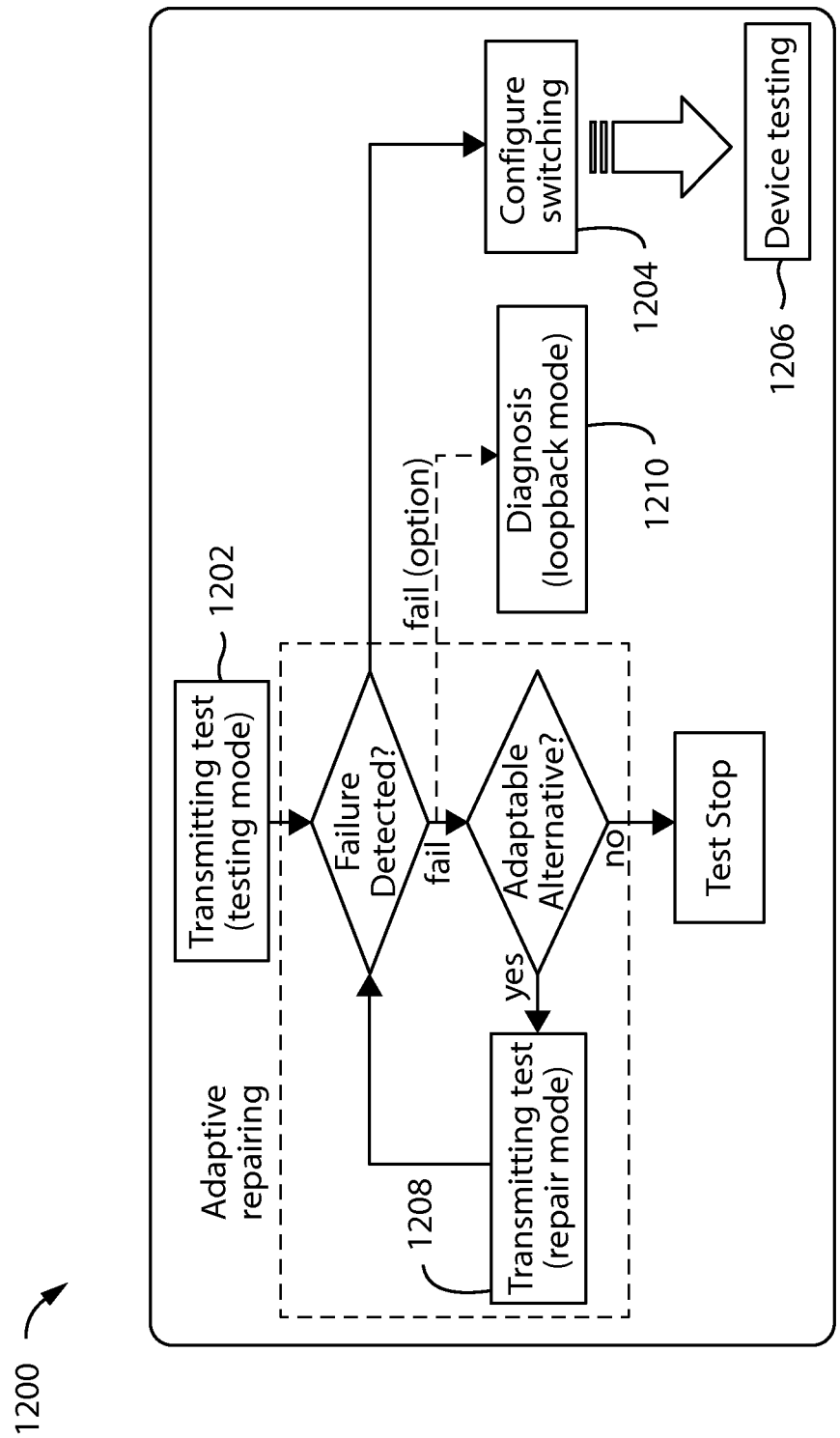
FIG. 12 depicts an example of a BTCU execution flow adaptive repairing that involves the various BTCU modes shown in FIG. 11.

FIG. 12 depicts an example of a BTCU execution flow 1200 for adaptive repairing that involves the various BTCU modes described above. As shown in FIG. 12, the BTCU execution flow 1200 starts in the testing mode at block 1202, where a transmitting test is conducted to check the continuity of interconnects in the RDL layer. If no RDL interconnect failure is detected, the BTCU execution flow 1200 proceeds to configure the testing circuitry for signal switching at block 1204, and then proceeds to conduct testing of the ICs of bottom package at block 1206. If, on the other hand, an RDL interconnect failure is detected by the transmitting test at block 1202, and a possible adaptive repairing solution/alternative does exist, the BTCU execution flow 1200 adopts such alternative repairing solution and proceed to conduct another transmitting test at block 1208. Such adaptive repairing process continues until no RDL interconnect failure is detected or no adaptive repairing alternative can be found. In the latter case, the test stops. In some embodiments, the BTCU execution flow 1200 can optionally enter the loopback mode at block 1210 if an RDL interconnect failure is detected, to diagnose and report the interconnect failure location(s).

Figure 13A:
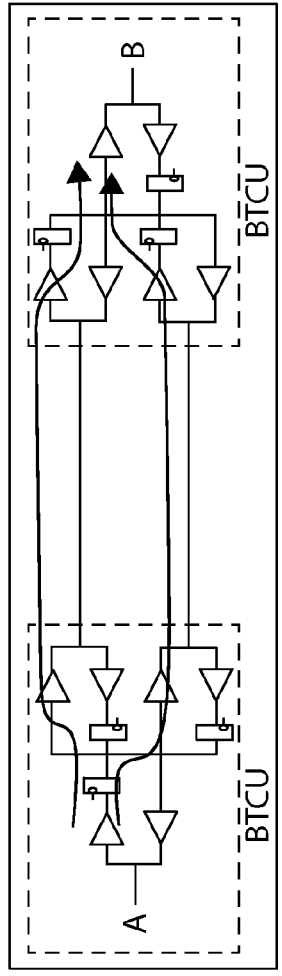
FIGS. 13A-C depict examples of multi-BTCU configurations for different function control purposes in accordance with some embodiments.
Figure 13B:
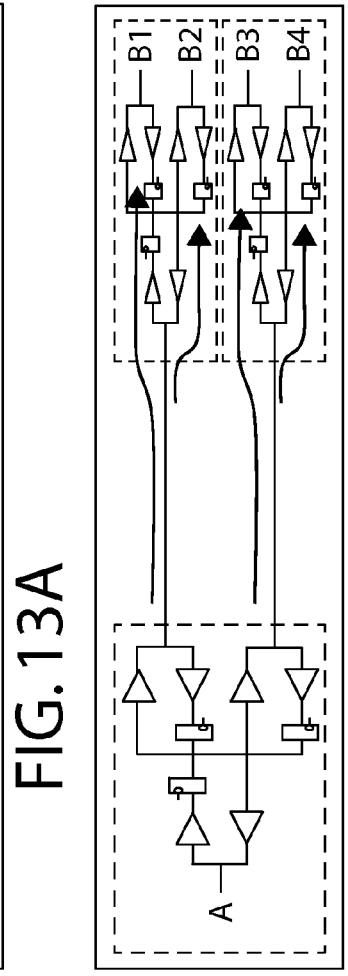
Figure 13C:
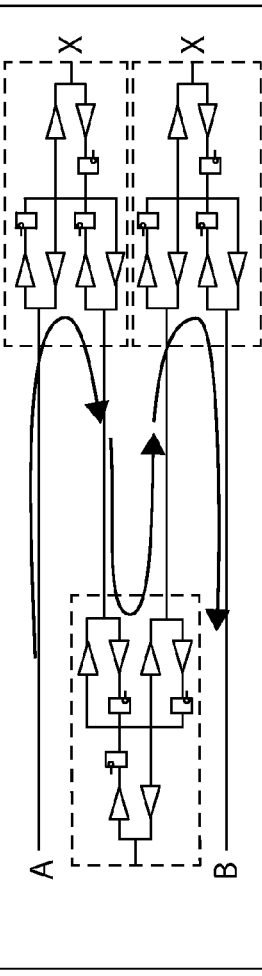

In some embodiments, a plurality of BTCUs can be configured to form various compositions to achieve the testing circuitry structure desired. FIGS. 13A-C depict a few non-limiting examples of multi-BTCU configurations for respectively different function control purposes. As shown in FIG. 13A, two BTCUs can be connected together to form a two-pin (A and B) component that can be used for a combination of one or more of testing, repairing and diagnosis purposes as described above. FIG. 13B depicts an example of a BTCU configuration where three BTCUs are configured in a tree-like distribution structure with multi-pin fanouts (B1, B2, B3, and B4) from pin A, wherein the BTCU structure can serve as a multiplexer having multiple possible outputs. FIG. 13C depicts an example of a chained BTCU structure in which multiple BTCUs are chained sequentially to form a chained structure for BTCU chain test between two end pins A and B, and signals can be transmitted through the chained structure bi-directionally from A to B and from B to A or uni-directionally from input pin A to output pin B only.

Figures 14A, 14B:
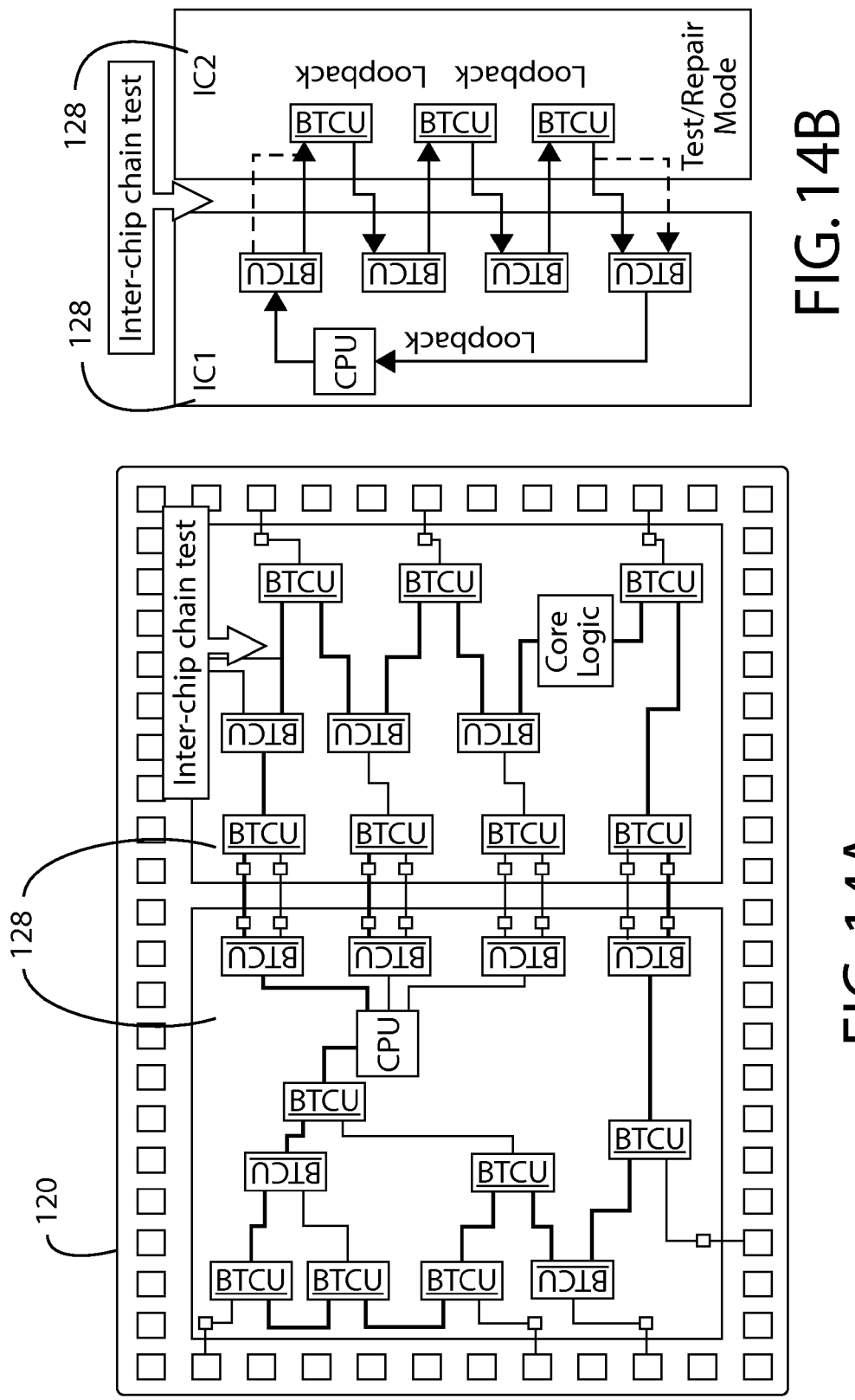
FIG. 14A depicts an example of an intra-chip chain test on a BTCU chain embedded within a single IC in the bottom package in accordance with some embodiments.
FIG. 14B depicts an example of an inter-chip chain test on a BTCU chain embedded within a single IC in the bottom package in accordance with some embodiments.

In some embodiments, the BTCU chain test as depicted in FIG. 13C can be either conducted as an intra-chip chain test on a BTCU chain that is embedded within a single IC/DUT 128 in bottom package 120 as shown in FIG. 14A or conducted as an inter-chip chain test on a BTCU chain that is embedded in at least two of the ICs/DUTs 128 in bottom package 120 as shown in FIG. 14B.

Figure 15A:
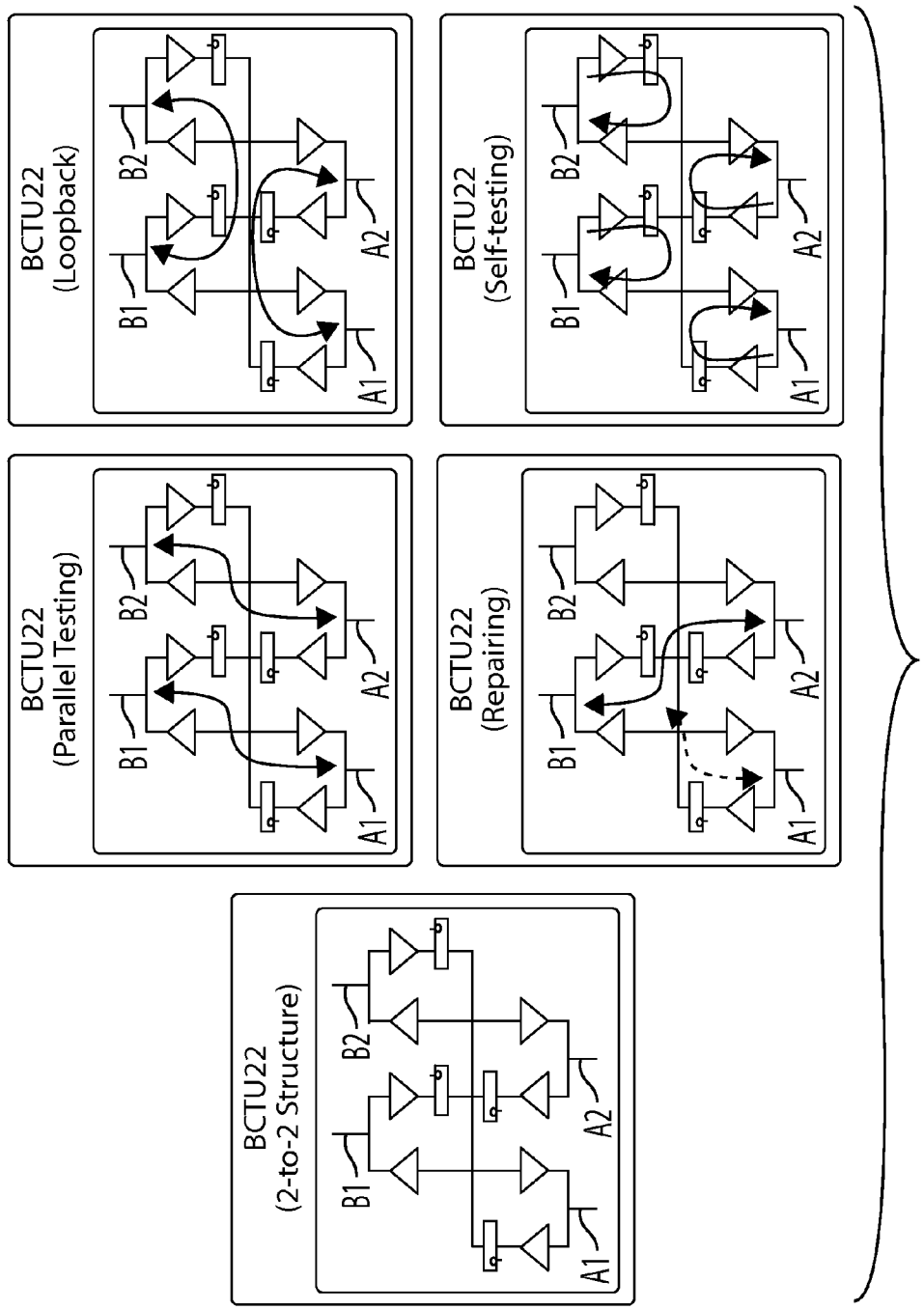
FIGS. 15A-C depict examples of extendable multi-path BCTU structure, which includes a plurality of signal paths through a plurality of BTCUs in accordance with some embodiments.
Figure 15B:
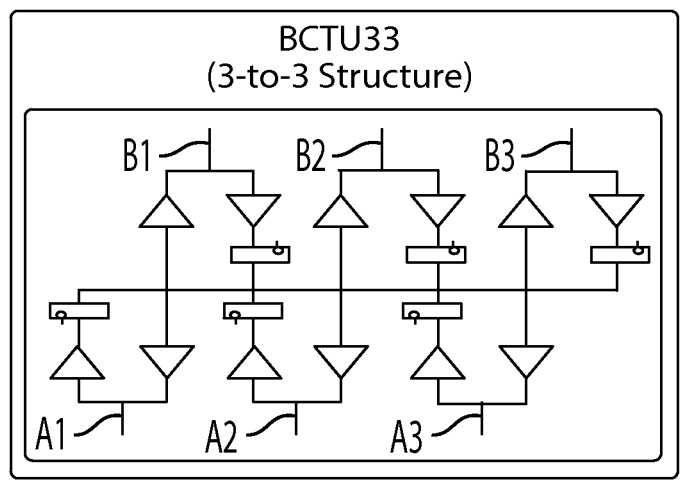
Figure 15C:
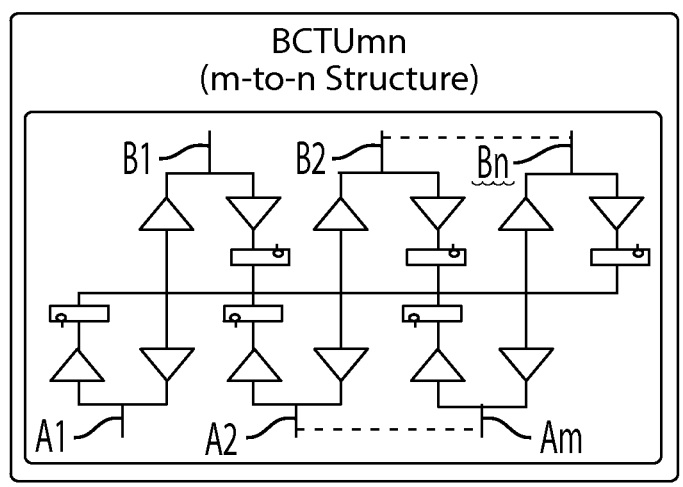

In some embodiments, an extendable multi-path BCTU structure can be formed wherein the multi-path BCTU structure includes a plurality of signal paths through a plurality of BTCUs, wherein each signal path has its own input and output that are separate from other signal paths in the multi-path BCTU structure. FIG. 15A depicts an example of a 2-to-2 multi-path BCTU structure referred to as BCTU22, which include four pins A1, A2, B1 and B2. When BCTU22 operates under multi-paths control signals (not shown), one of parallel testing, diagnosis (loopback), repairing, and self-testing mode using multiple signal paths exist wherein these signal paths are independent of each other each having its own input and output pins. As shown in FIG. 15A, signals are transmitted between paths A1/B1 and A2/B2 separately in both directions under the parallel testing mode. In loopback mode, signals are looped back between paths A1/A2 and B1/B2 without interactions between the two paths. In repairing mode, signals are switched away from potentially damaged path between A1 and B1, and are exchanged to path between B1 and A2 instead. In self-testing mode, each pin A1, A2, B1, and B2 is tested in sequence to make sure that the multi-path BCTU structure functions properly. In some embodiments, the multi-path BCTU structure can be further expanded to a 3-to-3 multi-path BCTU structure BTCU33 as shown by the example in FIG. 15B and more generally to a m-to-n multi-path BCTU structure BTCUmn as shown by the example in FIG. 15C.

In some embodiments, a device for testing a bottom package of an integrated fan-out (InFO) Package-on-Package (PoP) comprises a bottom fixture having a space to accommodate the bottom package during testing and a detachable top cover, configured for conducting at least one test of the bottom package, wherein one or both of the bottom fixture and the top cover have a plurality of probing contacts for testing of the bottom package and wherein the device can be opened for placement of the bottom package under testing, and the cover is attachable to the bottom fixture for conducting the testing.

In some embodiments, the bottom package comprises one or more integrated circuits (ICs) embedded in a material, a plurality of probing contact coupled to the ICs for connection with the probing contacts on the bottom fixture of the device, and a plurality of Thru InFO Vias (TIVs) formed through the material for connection with the replaceable top cover of the device.

In some embodiments, a side of the top cover facing the bottom fixture has a layer of conductive material attached thereto.

In some embodiments, a side of the top cover facing the bottom fixture has a plurality of conductive elements attached thereto, wherein the plurality of conductive elements are isolated from each other.

In some embodiments, the plurality of conductive elements are arranged as rings, each covering and testing a respective one of a plurality of rings of TIVs on the bottom package.

In some embodiments, a side of the top cover facing the bottom fixture includes a plurality of conductive interconnects, each connecting a respective set of the probing contacts in the top cover of the device.

In some embodiments, a side of the top cover facing the bottom fixture includes a substrate with a top IC placed thereon, for functional testing of the bottom package, the top IC configured for simulating an environment of the InFO POP when the top package is stacked.

In some embodiments, the top cover includes a hole, coupled to an air supplying source to introduce air from the air supplying source into the device, wherein the hole is placed amid the plurality of probing contacts on the side of the top cover facing bottom fixture.

In some embodiments, the detachable top cover is replaced automatically for testing of the bottom package during production by an IC test handler.

In some embodiments, a method for integrated fan-out (InFO) package-on-package (PoP) testing comprises a) incorporating one or more known good dies (KGDs) into a bottom package of an InFO PoP device through an InFO stacking process. The method further comprises b) conducting a wafer test on a bottom package having the KGDs via chip probing. The method further comprises c) dicing and stacking the bottom package in a test device for an InFO Known Good Stack (KGS) die test. The method further comprises d) stacking a top package on top of the bottom package to form the InFO-PoP if the bottom package passes the InFO KGS die test and e) putting the InFO-PoP package through a final test with both the top and the bottom packages stacked together.

In some embodiments, the method further comprises f) repeating steps d) and e) to further stack an additional package on the top package and test the InFO-PoP package.

In some embodiments, a method for testing of a bottom package of an integrated fan-out (InFO) Package-on-Package (PoP) comprises forming the bottom package being tested in a bottom fixture of a device and forming a top cover of the dual-side socket for conducting a plurality of tests of the bottom package. The method further comprises including a plurality of testing circuit components in a plurality of objects, wherein each of the objects is one of integrated circuits (ICs) and fixtures in one or more of the top cover of the socket and the bottom package being tested. The method further comprises conducting a test among the plurality of objects using the testing circuit components embedded in the plurality of objects.

In some embodiments, the method further comprises conducting the test for inter-connects among two or more different objects.

In some embodiments, the method further comprises conducting the test as a signal loop back test, wherein one or more of the testing circuit components loop a testing signal back to an IC that generates the signal.

In some embodiments, one or more of the testing circuit components are bidirectional test control units.

In some embodiments, the testing circuit components are controlled by one or more control signals generated by the objects the components embedded in.

In some embodiments, one or more of the testing circuit components are controlled to work under a testing mode where a testing signal is transmitted between pins of the testing circuit components in both directions.

In some embodiments, one or more of the testing circuit components are controlled to work under a diagnosis mode where a testing signal is looped back between pins of the testing circuit components instead of being transmitted forward.

In some embodiments, one or more of the testing circuit components are controlled to work under a repairing mode where a testing signal is switched away from damaged route between pins of the testing circuit components to an alternative route instead.

In some embodiments, one or more of the testing circuit components are controlled to work under a self-testing mode where each pin of one of the testing circuit components is tested in sequence to make sure that the testing circuit component functions properly.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A device for testing a bottom package of an integrated fan-out (InFO) Package-on-Package (PoP), comprising:
   a bottom fixture having a space to accommodate the bottom package during testing;
   a detachable top cover, configured for conducting at least one test of the bottom package, the detachable top cover including a plurality of conductive elements attached to a bottom surface of the top cover facing the bottom fixture; and
   a plurality of Thru InFO Vias (TIVs) extending from a top surface of the bottom package for providing electrical connection with the detachable top cover of the device,
   wherein the device is configured to be opened for placement of the bottom package under testing, and the top cover is attachable to the bottom fixture for conducting the testing, and
   wherein each conductive element is configured to electrically connect at least a subset of the plurality of the TIVs when the top cover is closed in order to test the bottom package,
   and wherein at least one of the plurality of conductive elements is formed as a ring.

2. The device of claim 1, wherein:
   the bottom package comprises:
   one or more integrated circuits (ICs) embedded in a material;
   a plurality of probing contacts coupled to the ICs for providing electrical connection with probing contacts on the bottom fixture of the device.

3. The device of claim 1, wherein:
   the bottom surface of the top cover facing the bottom fixture includes a plurality of conductive wires, each connecting a respective set of probing contacts in the top cover of the device.

4. The device of claim 1, wherein:
   the bottom surface of the top cover facing the bottom fixture includes a substrate with a top IC placed thereon, for functional testing of the bottom package, the top IC configured for simulating an environment of the InFO POP when the top package is stacked.

5. The device of claim 1, wherein:
   the top cover includes a hole, coupled to an air supplying source to introduce air from the air supplying source into the device, wherein the hole is placed amid the plurality of probing contacts on the bottom surface of the top cover facing bottom fixture.

6. The device of claim 1, wherein:
   the detachable top cover is replaced automatically for testing of the bottom package during production by an IC test handler.

7. A method for integrated fan-out (InFO) package-on-package
   (PoP) testing, comprising:
   a) incorporating one or more known good dies (KGDs) into a bottom package of an InFO-PoP device through an InFO stacking process;
   b) conducting a wafer test on the bottom package having the chip probing;

c) dicing and stacking the bottom package in a test device for an InFO Known Good Stack (KGS) die test;

d) stacking a top package on top of the bottom package to form the InFO-PoP if the bottom package passes the InFO KGS die test;

e) putting the InFO-PoP package through a final test with both the top and the bottom packages stacked together; and f) testing the bottom package through a plurality of Thru InFO Vias (TIVs) of the bottom package, wherein when a top cover of the top package is closed, at least a subset of the plurality of the TIVs is electrically connected to a plurality of conductive elements attached to a bottom surface of the top cover facing the bottom fixture, and wherein at least one of the plurality of conductive elements is formed as a ring.

8. The method of claim 7, further comprising:

g) repeating steps d) through f) to further stack an additional package on the top package and test the InFO-PoP package.

9. A method for testing of a bottom package of an integrated fan-out (InFO) Package-on-Package (PoP), comprising:

forming the bottom package being tested in a bottom fixture of a device;

forming a top cover of a dual-side socket for conducting a plurality of tests of the bottom package;

including a plurality of testing circuit components in a plurality of objects, wherein each of the objects is one of integrated circuits (ICs) and fixtures in one or more of the top cover of the socket and the bottom package being tested;

conducting a test among the plurality of objects using the testing circuit components embedded in the plurality of objects;

forming a plurality of Thru InFO Vias (TIVs) extending from a top surface of the bottom package for connection with the top cover of the socket; and forming a plurality of conductive elements attached to a bottom surface of the top cover facing the bottom fixture, wherein each conductive element is configured to electrically connect at least a subset of the plurality of the TIVs when the top cover is closed in order to test the bottom package, and wherein at least one of the plurality of conductive elements is formed as a ring.

10. The method of claim 9, further comprising:

conducting a test for inter-connects among two or more different objects.

11. The method of claim 9, further comprising:

conducting a test as a signal loop back test, wherein one or more of the testing circuit components loop a testing signal back to an IC that generates the signal.

12. The method of claim 9, wherein:

one or more of the testing circuit components are bidirectional test control units.

13. The method of claim 9, wherein:

the testing circuit components are controlled by one or more control signals generated by the objects the components embedded in.

14. The method of claim 13, wherein:

one or more of the testing circuit components are controlled to work under a testing mode where a testing signal is transmitted between pins of the testing circuit components in both directions.

15. The method of claim 13, wherein:

one or more of the testing circuit components are controlled to work under a diagnosis mode where a testing signal is looped back between pins of the testing circuit components instead of being transmitted forward.

16. The method of claim 13, wherein:

one or more of the testing circuit components are controlled to work under a repairing mode where a testing signal is switched away from damaged route between pins of the testing circuit components to an alternative route instead.

17. The method of claim 13, wherein:

one or more of the testing circuit components are controlled to work under a self-testing mode where each pin of one of the testing circuit components is tested in sequence to make sure that the testing circuit component functions properly.

\* \* \* \* \*